(12) United States Patent
Shepherd et al.

(10) Patent No.: US 6,803,960 B2
(45) Date of Patent: Oct. 12, 2004

(54) OPTICAL TEST STRUCTURE FOR MEASURING CHARGE-TRANSFER EFFICIENCY

(75) Inventors: John P. Shepherd, Rochester, NY (US); Eric G. Stevens, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 790 days.

(21) Appl. No.: 09/736,936

(22) Filed: Dec. 14, 2000

(65) Prior Publication Data

US 2001/0043274 A1 Nov. 22, 2001

Related U.S. Application Data

(60) Provisional application No. 60/171,698, filed on Dec. 22, 1999.

(51) Int. Cl.$^7$ ............................................... H04N 5/335
(52) U.S. Cl. ........................ 348/315; 348/243; 348/316
(58) Field of Search ........................... 348/207.99, 294, 348/302, 303, 311, 313, 314, 315, 316, 241, 243, 248; 250/208.1; 257/214, 215, 222, 223

(56) References Cited

U.S. PATENT DOCUMENTS

| | | | | |
|---|---|---|---|---|
| 4,989,095 A | * | 1/1991 | Whitesel et al. | ............ 348/314 |
| 5,369,357 A | | 11/1994 | Erhardt | |
| 5,486,859 A | * | 1/1996 | Matsuda | ...................... 348/311 |
| 5,521,639 A | | 5/1996 | Tomura et al. | |
| 6,157,407 A | * | 12/2000 | Kobayashi | ................... 348/241 |
| 6,721,009 B1 | * | 4/2004 | Iizuka | ......................... 348/314 |

FOREIGN PATENT DOCUMENTS

| | | | | |
|---|---|---|---|---|
| DE | 197 39 765 A1 | 3/1998 | ......... H01L/27/148 |
| JP | 07161960 | 6/1995 | ......... H01L/27/148 |
| JP | 11317516 | 11/1999 | ......... H01L/29/762 |

OTHER PUBLICATIONS

J. D. E. Beynon and D. R. Lamb, "Charge–Coupled Devices and Their Applications," McGraw–Hill, 1980, pp. 187–189.
Albert, J. P. Theuwissen, "Solid–State Imaging with Charge–Coupled Devices," Kluwer Academic Publishers, 1995 (book).
Robert W. Brodersen, Denis D. Buss, and A1 F. Tasch, Jr., "Experimental Characterization of Transfer Efficiency in Charge–Coupled Devices," IEEE Transactions On Electron Devices, vol. ED–22, No. 2, Feb. 1975, pp. 40–46.

(List continued on next page.)

Primary Examiner—Tuan Ho
(74) Attorney, Agent, or Firm—Peyton C. Watkins (57) ABSTRACT

An optically operated test structure for testing the charge transfer efficiency (CTE) of a charge coupled device (CCD) solid-state image sensor. A solid-state image sensor includes a substrate of a semiconductor material of one conductivity type having a surface. A plurality of spaced, parallel CCDs are in the substrate at the surface. Each CCD includes a channel region and a plurality of conductive gates extending across and insulated from the channel region. The conductive gates extend laterally across the channel regions of all of the CCDs and divide the channel regions into a plurality of phases and pixels. A drain region of the opposite conductivity type is in the substrate at the surface and extends along the channel region of at least one of the CCDs. A simply connected (rectangular) region of the plurality of spaced, parallel CCDs is photoactive. The CCDs outside this photoactive region are typically covered with metal or some other optically opaque material. One or more of the parallel CCD columns comprise optical test structures at the start and end of the CCD array and are photoactive. One or more parallel regions are adjacent and abutting on either side of the test structures; these may or may not be photoactive. These surrounding, adjacent regions are connected to a drain on the imager; the drain collects any charge captured in these adjacent regions. Each of the plurality of spaced, parallel, vertical CCDs is connected to one or more horizontal CCDs oriented in a direction perpendicular to the vertical CCDs.

20 Claims, 6 Drawing Sheets

OTHER PUBLICATIONS

Michael F. Tompsett, "Surface Potential Equilibration Method of Setting Charge in Charge–Coupled Devices," IEEE Transactions On Electron Devices, vol. ED–22, No. 6, Jun. 1975, pp. 305–309.

W. F. Kosonocky and J. E. Carnes, "Basic Concepts of Charge–Coupled Devices," RCA Review, vol. 36, Sep. 1975, pp. 566–593.

Gerald C. Holst, CCD Arrays, Cameras, and Displays, "4.1.1 Spectral Response," SPIE and JCD Publishing, 1996, pp. 92–96.

S. L. Kosman, et al., "A Large Area 1.3–Megapixel Full–Frame CCD Image Sensor With A Lateral–Overflow Drain And A Transparent Gate Electrode," IEDM Technical Digest, 1990, pp. 287–289.

E. J. Meisenzahl, et al., "A Six Million Pixel Full–Frame True 2φ CCD Image Sensor Incorporating Transparent Gate Technology and Optional Antiblooming Protection," SPIE Annual Meeting, 1999, pp. 1–9.

Eric G. Stevens, et al., Session X: Image Sensors And Processing Circuits, "A 1.4–Million–Element CCD Image Sensor," IEEE International Solid–State Circuits Conference, 1987, pp. 114, 115, and 364.

James Janesick, et al., "History and Advancement Of Large Area Array Scientific CCD Imagers," Astronomical Society of Pacific Conference Series, Tucson, AZ, 1991, pp. 1–40.

N. S. Saks, "A Technique For Suppressing Dark Current Generated by Interface States in Buried Channel CCD Images," IEEE Electron Device Letters, vol. EDL–1, No. 7, Jul. 1980, pp. 131–133.

James R. Janesick, et al., "Charge–Coupled–Device Charge–Collection Efficiency And The Photon–Transfer Technique," Optical Engineering, vol. 26, No. 10, Oct. 1987, pp. 972–980.

E. J. Meisenzahl, et al., "A 3.2 Million Pixel Full–Frame True 2φ CCD Image Sensor Incorporating Transparent Gate Technology," 2000 SPIE Photonics West Conference, San Jose, CA, Jan. 2000.

\* cited by examiner

OPTICAL TEST STRUCTURE FOR MEASURING CHARGE-TRANSFER EFFICIENCY

CROSS REFERENCE TO RELATED APPLICATION

Reference is made to and priority claimed from U.S. Provisional Application Ser. No. 60/171,698, filed Dec. 22, 1999, entitled OPTICAL TEST STRUCTURE FOR MEASURING CHARGE-TRANSFER EFFICIENCY.

FIELD OF THE INVENTION

The present invention relates to a charge-coupled device (CCD) solid-state image sensor having a built in test structure which utilizes an optical injection to measure the charge transfer efficiency for a CCD solid-state image sensor.

BACKGROUND OF THE INVENTION

Many high-end imaging applications today utilize large format, area CCD image sensors. These area arrays are composed of a two-dimensional array of pixels, often called the vertical or parallel registers, that are usually transferred row by row into a single row, often called the horizontal or serial register that is used to clock out the signal. Some sensors may have more than one horizontal register. The benefits of this architecture are the high sensitivity, high charge capacity and low dark currents resulting in very large dynamic ranges. An important measure of performance for these large format imager sensors is charge transfer efficiency (CTE), which measures how completely charge is transferred along a CCD register. Brodersen, et al., in "Experimental Characterization of Transfer Efficiency in Charge-Coupled Devices", published in IEEE Transactions on Electron Devices, ED-22, No. 2, February 1975, pp. 40–46, (incorporated herein by reference) describe the fixed loss, proportional loss and nonlinear loss of charge which degrade CTE. If CTE=1, then all of the charge has been transferred from one phase to the next. The fraction of charge left behind is called the charge transfer inefficiency (CTI) and CTI=1−CTE. If a fraction of charge from one pixel is left behind during transfer, it will result in a loss of contrast between adjacent pixels in the image. For color sensors, it can result in a hue shift, since the charge in adjacent pixels usually represents different colors. Mixing of the charge in adjacent pixels due to CTI will result in a change in color. Good CTE in both the vertical and horizontal registers is important, however, good CTE in the horizontal register is more difficult to achieve because of the higher clock frequency, or, alternatively, the short time available to transfer charge from one phase to the next. Since many of the large format image sensors now require well over 5000 transfers in a register, CTI of less than $10^{-5}$ (or CTE>0.99999) is important to maintain signal integrity and prevent contrast loss and color errors.

CTE is typically measured by the inclusion of a "fill and spill" electrical injection circuit (M. F. Tompsett, IEEE Transactions on Electron Devices, ED-22, No. 6, June 1975, pp. 305–309 and W. F. Kosonocky and J. E. Carnes, RCA Review, 36, p. 566, September 1975, incorporated herein by reference) incorporated on the input end of the CCD shift register (usually the horizontal). The difficulty with electrical injection structures (additional gates and diodes added at the end of a CCD shift register where charge packets are created by "clocking" a charge packet into the array) is that they require adjustment for each individual die, thus making automation of testing more difficult. In addition these small gates are sensitive to electrostatic discharge (ESD); loss of an otherwise functional device can result from ESD failure of the test structure.

X-ray radiation sources, such as $Fe^{55}$, provide a known and constant input level, but the additional apparatus and safety precautions inhibit its use in a production test environment. The fixed energy levels of a particular isotope also prohibit the ability of measuring CTE as a function of signal level. In addition, one of the most useful sources, $Fe^{55}$, has a limited useful lifetime.

Optical injection, i.e., the use of optically generated packets, has also been used for characterization of CTE for a linear array. Herbert J. Erhardt, U.S. Pat. No. 5,369,357 of Nov. 29, 1994 incorporated herein by reference, describes an implementation for linear CCD arrays. This requires separate gate controls to transfer the optically generated packets into the CCD register for characterization of CTE. This would be difficult to implement for area arrays.

SUMMARY OF THE INVENTION

This invention incorporates special pixels in the CCD imager that enable in-situ monitoring of CTE. These special pixels include a photoactive column (or columns) at the leading and trailing edge of the device beyond the dark reference regions. This column (or columns) is referred to as a vertical optical injection column. A charge packet for the CTE measurement is "injected" from the vertical optical injection column into the horizontal register by a normal row transfer.

In order to remove optical and diffusion crosstalk components arriving from the photoactive column, adjacent scavenging columns are added that transfer charge in the opposite direction of normal vertical charge transfer. These scavenging columns collect charge generated by stray light or charge generated below the depletion region of the optically active pixels that diffuses to the adjacent scavenging columns. These scavenging columns are electrically connected to drains at the top of the array to remove any charge collected in these pixels. The scavenging columns are not electrically connected to the horizontal CCD register; thus no charge is transferred from a vertical row into the corresponding pixels of the horizontal register under the scavenging columns.

The only charge read out from the horizontal pixel that follows the pixel containing the optical injection signal must come from charge that was not transferred so that an accurate measurement of CTE can be made. The input stimulus is supplied by illuminating the sensor with light. Varying light intensity or exposure produces a transfer curve of transfer efficiency as a function of signal. For each different exposure, there will be a resultant signal level. The resulting horizontal profile can be used to calculate the transfer efficiency in the case of few transfers (leading edge) and many transfers (trailing edge). If the sensor is uniformly illuminated or if it is read out such that the same charge is transferred from each pixel of the optical injection column or columns, horizontal profiles may be averaged to improve the accuracy of the CTE calculation. Software routines within a camera can use this information to compensate for such inefficiencies.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE INVENTION

Figure 1:
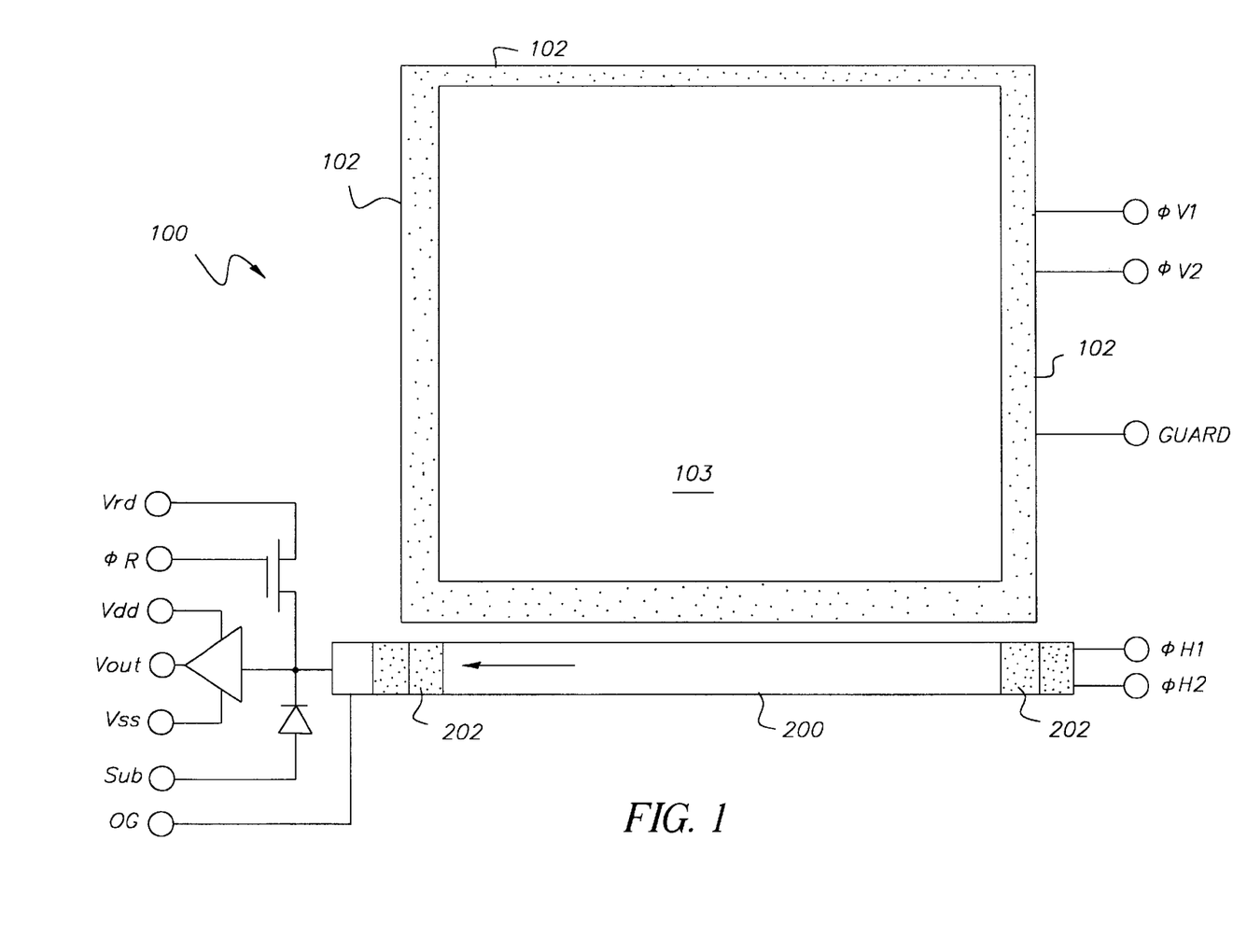
FIG. 1 is a schematic architectural diagram of an image sensor.

The fullframe CCD image sensor shown in FIG. 1 is used as an exemplary image sensor 100 in the following discussion. Not all aspects of the structure shown in FIG. 1 are known conventionally. Vertical CCD shift registers are formed, which serves as both the integrating photoactive region and for parallel (line by line) readout of the pixels.

Each vertical (parallel) register includes a rectangular array of pixels. The photoactive area or image area, 103, is usually surrounded by a dark reference area 102 comprising pixels covered with an opaque material or light shield 1021, such as metal, which blocks the incident radiation of interest. A horizontal register, 200, accepts each row or line from the vertical registers one at a time, and shifts charge packets from the pixels to a single output node $V_{out}$ in a serial fashion. The output node $V_{out}$ converts each charge packet into a voltage, which can be processed and digitized.

Figure 2:
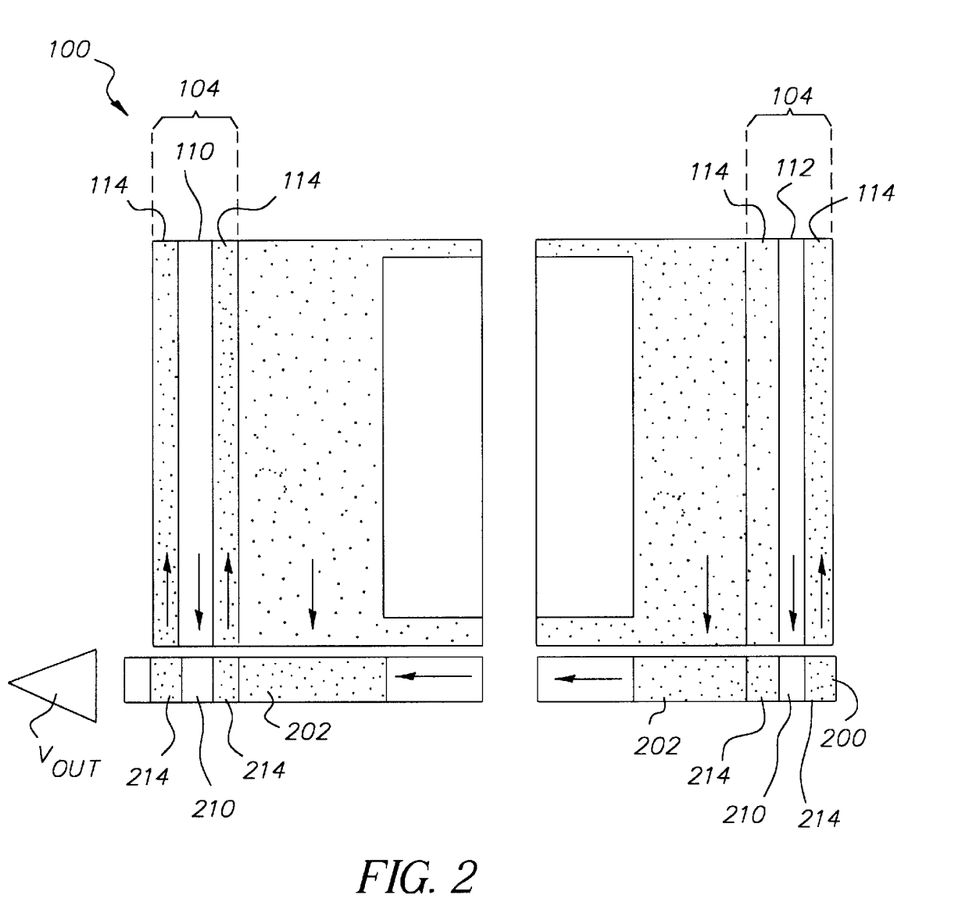
FIG. 2 is a schematic diagram illustrating detail of the dark area along the edge of the image sensor shown in FIG. 1.
Figure 3:
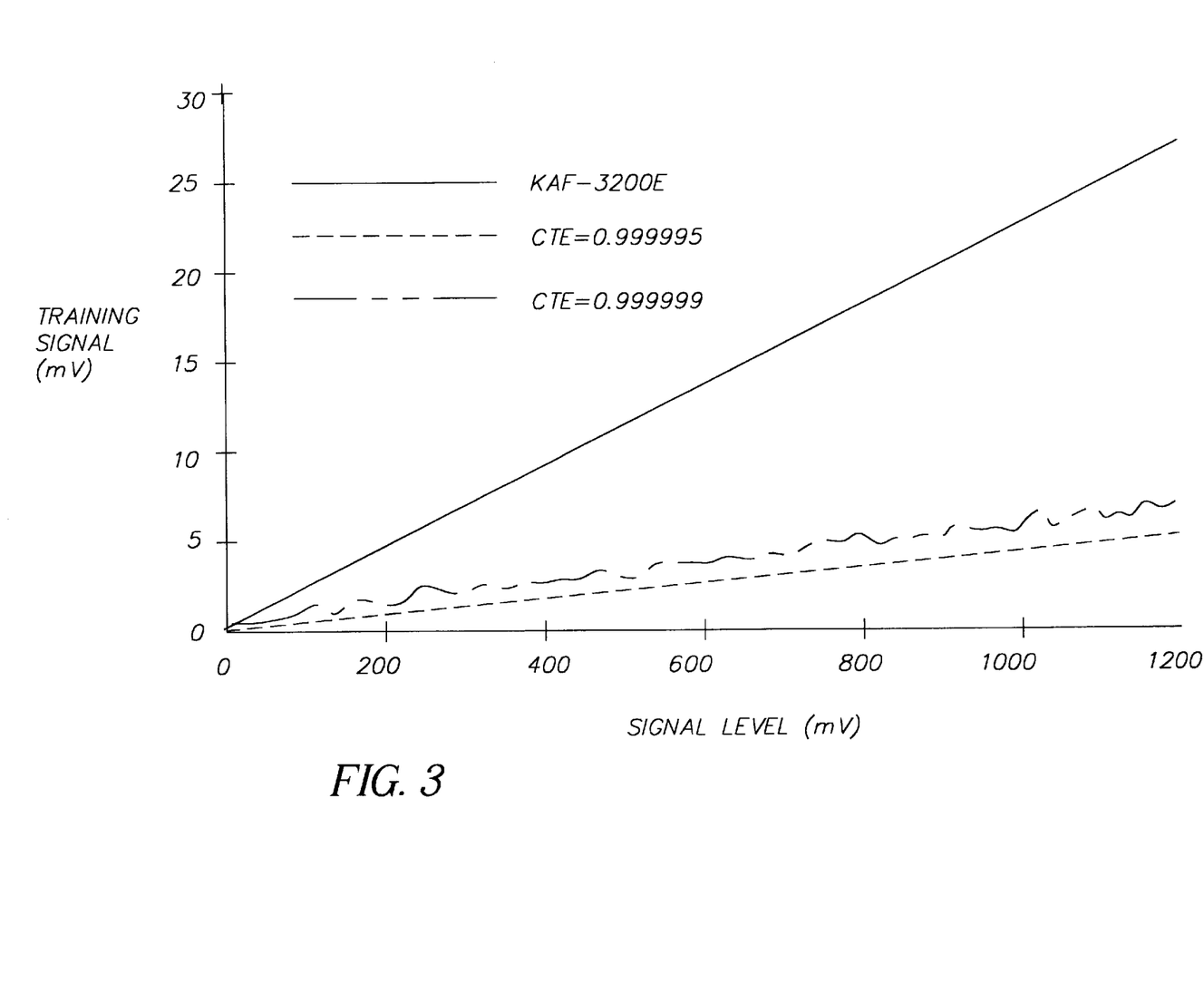
FIG. 3 is a graph illustrating a plot of the signal value of the light sensitive column as a function of signal found in the adjacent trailing column.
Figure 4:
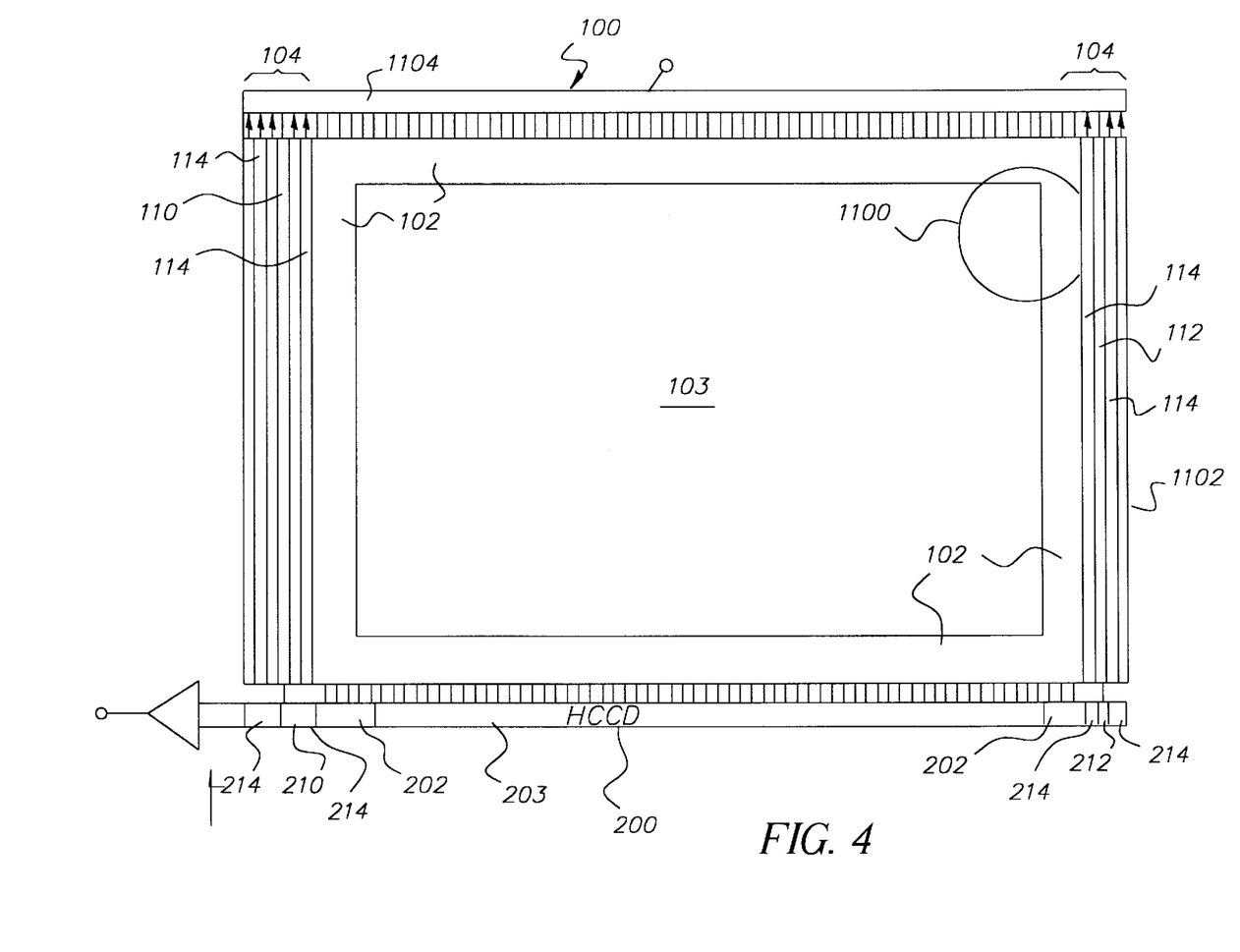
FIG. 4 is a schematic diagram illustrating an image sensor.

Contained within the column grouping forming the optical injection structure 104 (see FIG. 2) at the leading and trailing edges of the device beyond the dark reference regions 102 are special pixels that enable in-situ monitoring of CTE. As shown in FIG. 2, these pixels include optical injection columns 110 and 112, which are photoactive and are bounded on each side by scavenging columns 114. In order to remove optical and diffusion crosstalk components and spurious charges from the periphery 1102 (FIG. 4), scavenging columns 114 are added on both sides of the optical injection columns 110 and 112. The scavenging columns 114 may be covered with an opaque material such as metal and transfer any collected charge in the opposite direction of normal vertical charge transfer to a drain (as shown by the arrows in FIG. 2). More importantly, since the scavenging columns are not connected to the horizontal register 200, no spurious signal is transferred into the horizontal pixels 214 of the horizontal register. As shown in FIG. 4, a drain 1104 at the top of the array is electrically connected to the scavenging columns 114 to remove any charge collected in these scavenging pixels.

The input stimulus is supplied by illuminating the sensor with light. Electrons generated by this light in the optical injection columns 110 and 112 are "injected" or transferred from each row into pixels 210 and 212, respectively of the horizontal register 200. The resulting horizontal profile, shown in FIG. 5, can be used to calculate the transfer efficiency in the case of few transfers (leading edge) and many transfers (trailing edge).

Figure 7:
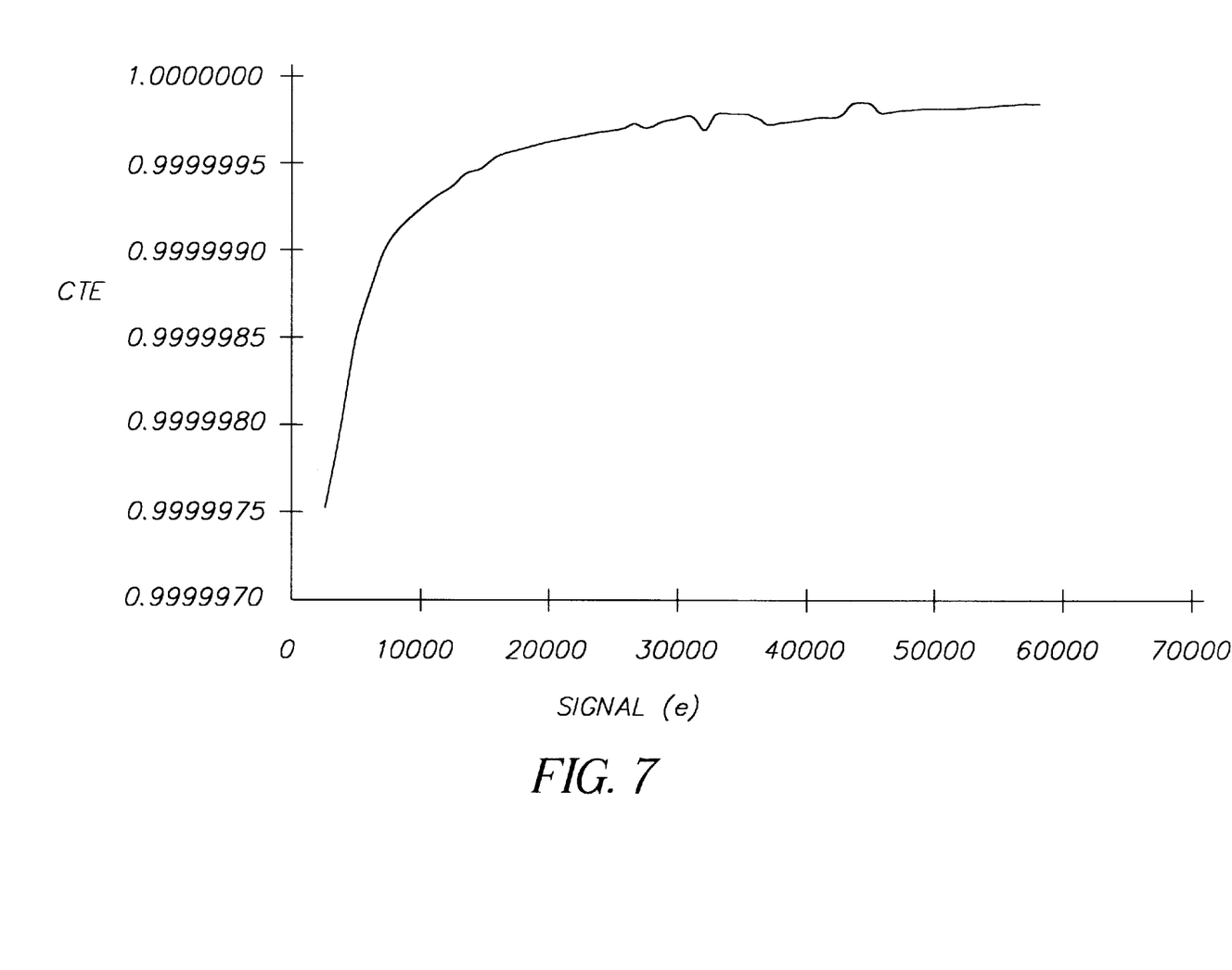
FIG. 7 is a transfer curve of horizontal CTE vs. signal level.

Horizontal charge transfer efficiency is composed of several components; among these are charge transfer from the first phase of the horizontal register over the gate onto the output structure and transfer along the horizontal register. The optical injection structure 104 at the leading edge, which includes the optical injection column 110, primarily measures the CTE over the first gate onto the output structure, since there are so few transfers from the optical injection column 110 to the output. The CTE along the horizontal register usually dominates for the optical injection structure 104 at the trailing edge, containing the optical injection column 112, since this typically involves thousands of transfers. A sequence of measurements with varying light intensity or exposure, e.g., from low to high exposure, produces a transfer curve of transfer efficiency as a function of signal. FIG. 7 shows a typical transfer curve for the case of injection from optical injection column 112 at the trailing edge of the register.

Figure 5:
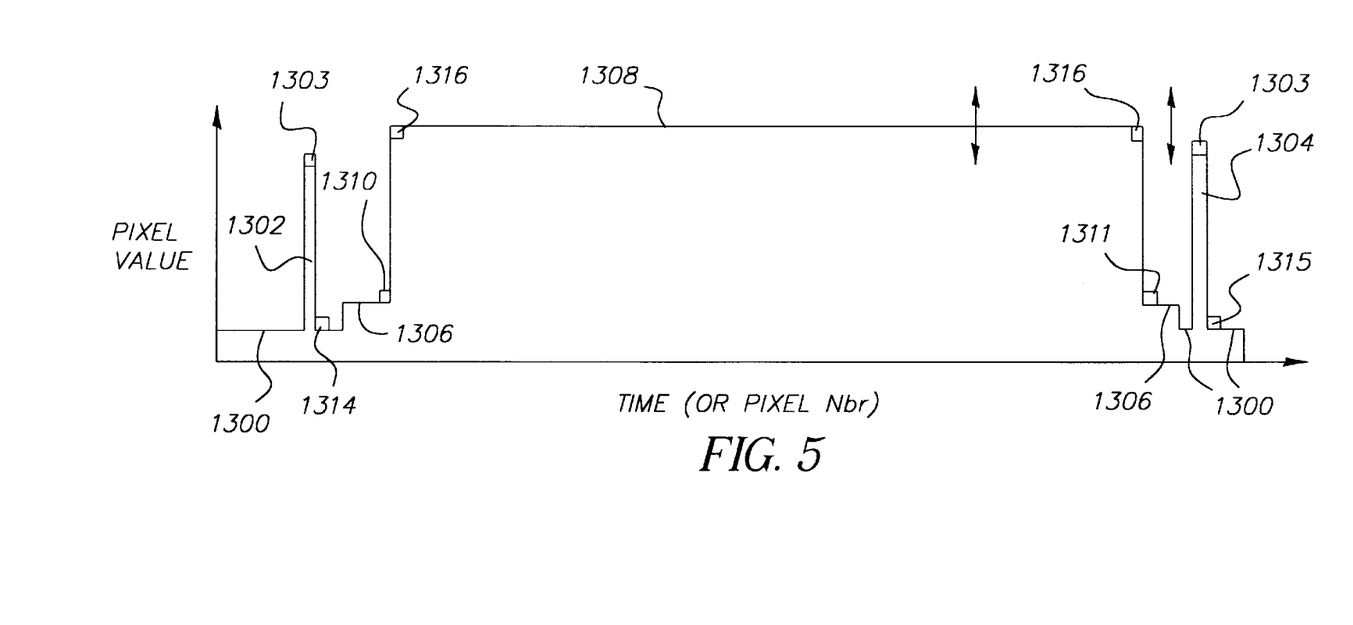
FIG. 5 is a plot of signal vs. column number for the structure shown in FIG. 4.

The invention provides an optical structure for injecting charge into the horizontal register of an area-array CCD image sensor for characterization and calibration of the horizontal register. This structure can be used to measure the charge-transfer efficiency (CTE) of the horizontal register versus signal level. After a line of a vertical register has been transferred into the horizontal register 200, it is transferred serially to the output amplifier $V_{out}$. FIG. 5 shows a plot of the signal at the output amplifier vs. column number for a typical line of the imager. The signal 1300 from the "dummy" or overclock region contains no charge. This is the zero reference level for the image. The signal 1302 from the first optical injection column 110 is followed by the trailing signal 1314 in the trailing horizontal pixel 214. Scavenging columns 114 do not contribute any signal to horizontal pixels 214 since the columns are not connected to the horizontal register 200. The trailing signal 1314 is only due to charge left behind due to transfer inefficiency. It is usually more useful to consider the size of 1314 for the leading optical injection structure 104 rather than the CTI, since there are so few transfers.

The box 1303 represents signal lost by CTI (which shows up as 1314 in the trailing pixel) and signal lost by diffusion from the optical injection columns 110 to the scavenging columns 114. The signal 1306 is the dark current signal from the dark reference columns under the light shield 1021. The dark reference column adjacent to the first photoactive column in the image area 103 has an additional signal 1310 which is partly composed of the signal 1316 lost due to diffusion of photo-generated electrons under the first photoactive column of the image area 103. All other photoactive columns in the image area 103 lose charge due to diffusion, but most of them also gain diffusion charge from adjacent columns. The first and last photoactive columns have less signal because they don't have a photoactive column on one side to contribute diffusion charge. (Actually, the first and last "few" columns should have less signal, depending on the wavelength of the incident light, but this application simplifies, to first order for the sake of ease of understanding.) This size of the signals 1310 and 1311 depends on the wavelength of light. The signal is smaller for incident blue light and grows larger as the incident wavelength grows larger (redder). Incident light with a longer wavelength (red) will create a larger diffusion signal 1310 (or 1311) since it has a longer absorption depth. Charge is generated further below the pixel depletion (or collection) region and more will by diffuse to adjacent pixels.

Each row of the image area 103 contributes signal 1308, which is transferred to pixels 203 of the horizontal register.

In this example, we have assumed that the sensor is illuminated with a spatially uniform light source. The signal in the last photoactive column of the image area 103 also experiences a signal loss 1316 due to diffusion of charge to the dark reference region 102. This lost signal shows up as a part of the additional signal 1311 in the first trailing column of the dark reference region 102. Optical crosstalk also contributes to 1311. Unlike 1310, the signal 1311 also has a component due to CTI, since this pixel trails a photoactive column.

Figure 6:
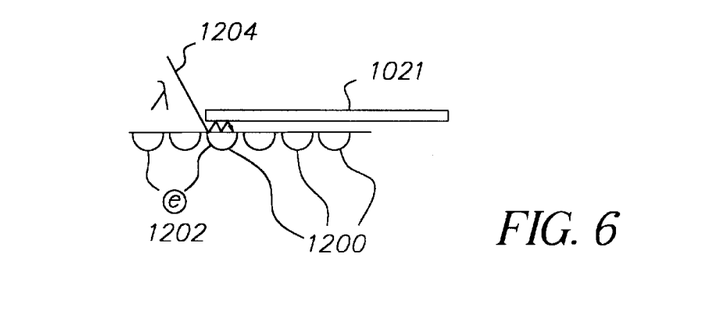
FIG. 6 is a schematic diagram showing a detailed cross section for a portion of the image sensor shown in FIG. 4.

FIG. 6 illustrates an exploded detail cross section of the circle shown as item 1100 in FIG. 4. More specifically, FIG. 6 illustrates the dark reference region 102 and a few of the pixels 1200 that are adjacent to an edge of the dark reference region 102. Light 1204 that is incident at the edge of the dark reference light shield 1021 may be "piped" by the optical waveguiding of the layers to pixels 1200. In addition, electrons 1202 generated below the depletion region also may diffuse to pixels 1200. This extra signal in pixels 1200 is due to optical and diffusive crosstalk and to CTI. This signal 1311 from the first trailing dark reference column of the dark reference region 102 is transferred into the horizontal register. In conventional structures, it is difficult to decide how much of the trailing signal 1311 is due to diffusion of charge from an adjacent column in the vertical register or waveguiding of light and how much is due to transfer inefficiency in the horizontal register. This seriously compromises any CTI calculation at the transition from the last column in the image area 103 to the first column in the dark reference region 102. In addition, this trailing signal 1311 depends on the wavelength of the incident light.

However, with the invention, the signal 1306 known to be charge transferred into the horizontal pixels 202 from the dark reference region 102 and can be separated from signal 1310. Further, because of the drain 1104 connection to the scavenging columns 114, the signal 1300 due to charge packets in horizontal pixels 214 does not contain any charge from the scavenging column (or columns) 114 in the vertical register since these columns are not connected to the horizontal register. The signal 1300 gives the background or zero reference for the optical injection column. If desired, the scavenging column on the leading side of the optical injection column can be omitted.

The signal 1304 is due to charge transferred from the trailing optical injection column 112. A key point of this invention is that the signal 1315 in the adjacent, trailing pixel in the horizontal register is only from charge left behind due to transfer inefficiency, since no signal from the scavenging column (or columns) 114 is transferred into the horizontal pixels 214. Further, the signal 1315 is independent of the wavelength of incident light used in the test, since the adjacent column containing the charge due to diffusion is not connected to the horizontal register. The signal 1300 is from the horizontal overclock, which is the repeated transfer of empty pixels after the signal from all the columns has been transferred out.

From FIG. 5, a simple estimate of the CTI per transfer from optical injection column 112 can be calculated as CTI=(S(1315)−S(1300))/(S(1304)−S(1300)+S(1315)−S(1300))/N, where N is the number of transfers from pixel 212 to the output. This assumes that the trailing signal after 1315 is negligible (in other words, the CTE is relatively good) and that the CTI due to the transfer at the first stage is neglected. A similar equation holds for the CTI per transfer from the optical injection column 110 of the leading optical injection structure 104, but S(1315) is replaced by S(1314) and N is the number of transfers from pixel 210 to the output.

Consider the following example for the leading optical injection column 110. Assume that the horizontal overclock signal 1300 is 2000 electrons, the optical injection signal 1302 in pixel 210 (from optical injection column 110) is 12000 electrons, the trailing signal 1314 is 80 electrons, and the optical injection column number is 20 for a two-phase horizontal clock. The CTI would be CTI=(80)/(12000−2000)/20*2=2E-4 and CTE=1−CTI=0.9998. Consider the trailing optical injection column 112. Assume that the horizontal overclock signal 1300 is 2000 electrons, the optical injection signal 1304 from optical injection column 112 is 12000 electrons, the trailing signal 1315 is 100 electrons, and the optical injection column number is 1000 for a two-phase horizontal clock, the CTI would be CTI=(100)/(12000−2000)/1000*2=5E-6 and CTE=1−CTI=0.999995. In this example, the trailing signal 1314 (following pixel 210), 80 electrons, at the leading injection structure is almost as large as the trailing signal 1315 (following pixel 212) of 100 electrons at the trailing injection structure. Thus, the leading optical injection structure 104 shows that most of the transfer inefficiency occurs at the transfer from the first horizontal phase, since there are so few transfers to the output from 210. The trailing optical injection structure 104 indicates that the transfer efficiency along the horizontal register is good.

If necessary, this estimate can be improved by iteration. More specifically, the invention can decompose the CTI into the sum of charge loss at the first phase to the output and charge loss due to N transfers along the register and substitute [S(1315)−S(1314)] for S(1315) and calculate CTI per transfer using pixel 212 of the trailing optical injection structure 104, ignoring the charge loss at the first phase. Thus, the invention can use this estimate of CTI per transfer to calculate the charge loss at the first phase using the leading optical injection structure 104 and iterate until the results converge.

The invention has been described in detail with particular reference to certain preferred embodiments thereof, but it will be understood that variations and modifications can be effected within the spirit and scope of the invention. For example, this optical test structure could be used on interline transfer, frame transfer, and frame interline transfer CCD image sensors. In each case, adjacent and abutting columns that do not transfer charge into the horizontal register surround the optical injection column (or columns).

PARTS LIST 100 exemplary image sensor
102 dark reference area (or region)
103 image area
104 optical injection structure
110 optical injection column
112 optical injection column
114 scavenging column
200 horizontal register
202 horizontal pixels
203 pixel
210 pixel
212 pixel
214 horizontal pixels
1021 light shield
1100 item
1102 periphery
1104 drain
1200 pixel
1202 electrons
1204 light -continued

PARTS LIST

| | |
|---|---|
| 1300 | signal |
| 1302 | signal |
| 1303 | box |
| 1304 | signal |
| 1306 | signal |
| 1308 | signal |
| 1310 | signal |
| 1311 | signal |
| 1314 | signal |
| 1315 | signal |
| 1316 | signal |

What is claimed is:

1. An image sensor comprising:
a photoactive area including rows and columns of pixels;
a light shield surrounding said photoactive area;
at least one photoactive test column adjacent said light shield;
at least one inactive column positioned adjacent said photoactive test column, wherein said photoactive test column is positioned between said light shield and said inactive column.

2. The image sensor in claim 1, further comprising a horizontal shift register connected to said photoactive area and said photoactive test column.

3. The image sensor in claim 2, wherein said inactive column is disconnected from said horizontal shift register.

4. The image sensor in claim 2, wherein a trailing signal following a signal from said photoactive test column represents a relative inefficiency of said horizontal shift register.

5. The image sensor in claim 1, further comprising a guard ring connected to said inactive column.

6. The image sensor in claim 5, wherein said guard ring is electrically isolated from said horizontal shift register.

7. The image sensor in claim 1, wherein said at least one inactive column comprises at least two inactive columns positioned on opposite sides of said photoactive test column.

8. An image sensor area array comprising:
an array of pixels arranged in a series of rows and columns;
a plurality of vertical shift registers operatively coupled to said columns;
at least one horizontal shift register coupled to said vertical shift registers, said horizontal shift register having a front end and a back end;
an output structure electrically connected to said horizontal shift register at said front end;
at least one photoactive test column of pixels that transfers charge to said horizontal shift register; and
at least one inactive column of pixels adjacent said photoactive test column and being farther from said front end than said photoactive column is from said front end, said inactive column being disconnected from to transfer charge into said horizontal shift register.

9. The image sensor array in claim 8, further comprising at least one shielded column for providing a dark reference level, said shielded column being electrically connected to said horizontal shift register.

10. The image sensor array in claim 8, wherein a trailing signal following a signal from said photoactive test column represents a relative inefficiency of said horizontal shift register.

11. The image sensor array in claim 8, further comprising a guard ring connected to said inactive column.

12. The image sensor array in claim 8, wherein said guard ring is electrically isolated from said horizontal shift register.

13. The image sensor array in claim 8, wherein said at least one inactive column comprises at least two inactive columns positioned on opposite sides of said photoactive test column.

14. An image sensor area array comprising:
an array of pixels arranged in a series of rows and columns;
a plurality of vertical shift registers operatively coupled to said columns;
at least one horizontal shift register coupled to said vertical shift registers, said horizontal shift register having a front end and a back end;
an output structure electrically connected to said horizontal shift register at said front end; and
at least one photoactive test column of pixels connected to transfer charge into said front end of said horizontal shift register.

15. The image sensor array in claim 14, further comprising at least one inactive column of pixels adjacent said photoactive test column and being farther from said front end than said photoactive column is from said front end, said inactive column being configured not to transfer charge into said horizontal shift register.

16. The image sensor array in claim 14, further comprising at least one shielded column for providing a dark reference level, said shielded column being electrically connected to said horizontal shift register.

17. The image sensor array in claim 14, wherein a trailing signal following a signal from said photoactive test column represents a relative inefficiency of said horizontal shift register.

18. The image sensor array in claim 15, further comprising a guard ring connected to said inactive column.

19. The image sensor array in claim 18, wherein said guard ring is electrically isolated from said horizontal shift register.

20. The image sensor array in claim 15, wherein said at least one inactive column comprises at least two inactive columns positioned on opposite sides of said photoactive test column.

* * * * *